United States Patent
Teng

(10) Patent No.: US 6,245,486 B1
(45) Date of Patent: Jun. 12, 2001

(54) METHOD FOR IMAGING A PRINTING PLATE HAVING A LASER ABLATABLE MASK LAYER

(76) Inventor: Gary Ganghui Teng, 10 Kendall Dr., Nothborough, MA (US) 01532

( * ) Notice: Subject to any disclaimer, the term of this patent is extended or adjusted under 35 U.S.C. 154(b) by 0 days.

(21) Appl. No.: 09/607,400

(22) Filed: Jun. 30, 2000

(51) Int. Cl.$^7$ ............... G03F 7/20; G03F 7/24; G03F 7/40; G03F 7/36
(52) U.S. Cl. ............ 430/303; 430/302; 430/309; 430/306; 430/273.1; 101/450.1; 101/451
(58) Field of Search .................. 430/302, 306, 430/309, 303; 101/450.1, 451

(56) References Cited

U.S. PATENT DOCUMENTS

| | | | |
|---|---|---|---|
| 3,997,349 | 12/1976 | Sanders | 96/75 |
| 4,132,168 | 1/1979 | Peterson | 101/471 |
| 5,258,263 | 11/1993 | Cheema et al. | 430/309 |
| 5,616,449 | 4/1997 | Cheng et al. | 430/302 |
| 5,858,604 | 1/1999 | Takeda et al. | 430/162 |
| 5,888,697 | 3/1999 | Fan | 430/273.1 |
| 5,922,502 | 7/1999 | Damme et al. | 430/162 |
| 6,014,929 | 1/2000 | Teng | 101/456 |
| 6,020,108 | 2/2000 | Goffing et al. | 430/306 |
| 6,037,102 | 3/2000 | Loerzer et al. | 430/306 |
| 6,071,675 | 6/2000 | Teng | 430/302 |

FOREIGN PATENT DOCUMENTS

WO-97/00777-A2 * 1/1997 (WO) .

* cited by examiner

Primary Examiner—Cynthia Hamilton

(57) ABSTRACT

This patent describes a method of imaging a printing plate comprising on a substrate a photosensitive layer and a top laser ablatable mask layer. The method includes imagewise exposing the plate with an infrared laser to remove the mask layer in the exposed areas, overall exposing the plate with an actinic light to harden or solubilize the photosensitive layer in the areas where the mask layer has been removed, and further exposing the plate with the infrared laser radiation in the laser non-exposed areas to remove the remaining mask layer. The fully exposed plate can be developed to bare the substrate in the non-hardened or solubilized areas of the photosensitive layer.

20 Claims, No Drawings

METHOD FOR IMAGING A PRINTING PLATE HAVING A LASER ABLATABLE MASK LAYER

FIELD OF THE INVENTION

This invention relates to printing plates, including lithographic printing plates and flexographic printing plates. More particularly, it relates to a method of exposing a printing plate comprising on a substrate a photosensitive layer and a top laser ablatable mask layer.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate. The exposed plate is usually developed with a liquid developer to bare the substrate in the non-hardened or solubilized areas.

On-press ink and/or fountain solution developable lithographic printing plates have been disclosed in the literature. Such plates can be directly mounted on press after exposure to develop with ink and/or fountain solution during the initial prints and then to print out regular printed sheets. No separate development process before mounting on press is needed. Among the patents describing on-press ink and/or fountain solution developable lithographic printing plates are U.S. Pat. Nos. 5,258,263, 5,516,620, 5,561,029, 5,616, 449, 5,677,110, 5,811,220, 6,014,929, and 6,071,675.

Conventionally, the plate is exposed with an actinic light (usually an ultraviolet light from a lamp) through a separate photomask film having predetermined image pattern which is placed between the light source and the plate. While capable of providing plate with superior lithographic quality, such a method is cumbersome and labor intensive.

Laser sources have been increasingly used to imagewise expose a printing plate which is sensitized to a corresponding laser wavelength. This would allow the elimination of the photomask film, reducing material, equipment and labor cost.

Lithographic plates comprising on a substrate an actinic light sensitive layer and a top mask layer which is opaque to the actinic light and is capable of being removed or rendered transparent to the actinic light by a non-actinic laser radiation have been disclosed in the literature. The plate is first imagewise exposed with a non-actinic laser to remove or render transparent the mask layer in the exposed areas, and then overall exposed with the actinic light. The remaining areas of the mask layer and the non-hardened or solubilized photosensitive layer are then removed by one or more liquid development processes. Examples of such plates are described in U.S. Pat. Nos. 4,132,168, 5,858,604, and 5,922, 502. While such plates are capable of digital imaging and can provide durability as good as conventional plates, they require one or more cumbersome liquid chemical processes after exposure to remove the mask layer and develop the photosensitive layer. It would be desirable if such liquid chemical processes can be eliminated or reduced in processing such a plate.

Flexographic printing plates are well known for use in letterpress printing, particularly on surfaces which are soft and easily deformable, such as cardboards and plastic films. Flexographic printing plates (processed) consist of raised image areas and non-raised non-image areas. Ink is transferred from the raised image areas to printing media. At present time, flexographic printing plates (processed) are usually made from a non-processed flexographic printing plate comprising a photopolymerizable layer on a dimensionally stable support, such as polyester film and aluminum sheet (also called flexographic printing plate).

Flexographic printing plates comprising on a support a photosensitive layer and a top infrared laser ablatable mask layer have been disclosed in the patent literature. Such plates can be exposed by first imagewise exposing with infrared laser radiation to remove the mask layer in the exposed areas and then overall exposing with an actinic radiation to harden the photosensitive layer in the laser exposed areas. The remaining areas of the mask layer and the non-hardened photosensitive layer are then removed by one or more liquid development processes. Examples of such plates are described in U.S. Pat. Nos. 5,719,009, 5,705,310, 6,037,102, and 6,020,108. While the above plates allow direct imagewise exposure with infrared laser and allow elimination of the negative film, the liquid mask layer removal process is cumbersome and generates liquid chemical waste. It would be desirable if such a liquid process can be eliminated in processing such a plate.

SUMMARY OF THE INVENTION

It is an object of this invention to provide a method of exposing a printing plate (including lithographic plate and flexographic plate) comprising on a substrate a photosensitive layer and a top mask layer without requiring a liquid mask layer removal process.

It is another object of this invention to provide a method of removing the initially non-ablated areas of mask layer of the above printing plate by direct laser exposure after actinic light overall exposure.

It is another object of this invention to provide a method of on-press exposing and processing a lithographic plate comprising on a substrate an ink and/or fountain solution developable photosensitive layer and a top mask layer.

Further objects, features and advantages of the present invention will become apparent from the detailed description of the preferred embodiments.

According to the present invention, there has been provided a method of imaging a printing plate, comprising in order:

(a) providing a printing plate comprising, in order, (i) a substrate; (ii) a photosensitive layer capable of hardening (negative-working) or solubilization (positive-working) upon exposure to an actinic radiation in ultraviolet and visible region; and (iii) an infrared laser ablatable mask layer which is substantially opaque to the actinic radiation and is capable of being removed upon exposure to an infrared laser radiation;

(b) imagewise exposing the plate with the infrared laser radiation to selectively remove the exposed areas of the mask layer;

(c) overall exposing the plate with the actinic radiation to cause hardening or solubilization of the photosensitive layer in the areas wherein the mask layer has been removed by the infrared laser radiation; and (d) further exposing the plate with the infrared laser radiation in, at least, part or all of the areas which have not been exposed with infrared laser radiation in step (b) to substantially remove the mask layer in said areas.

The above printing plate can be a lithographic printing plate or a flexographic printing plate. For a lithographic plate, the photosensitive layer should exhibit an affinity or aversion substantially opposite to the affinity or aversion of the substrate to at least one printing liquid selected from the group consisting of ink and an abhesive fluid for ink.

According to another aspect of the present invention, there has been provided a method of lithographically printing images on a receiving medium, comprising in order:

(a) providing a lithographic plate comprising (i) a substrate; (ii) a photosensitive layer capable of hardening (negative-working) or solubilization (positive-working) upon exposure to an actinic radiation in ultraviolet and visible region, the non-hardened or solubilized areas of said photosensitive layer being soluble or dispersible in ink (for waterless plate) or in ink and/or fountain solution (for wet plate), and said photosensitive layer exhibiting an affinity or aversion substantially opposite to the affinity or aversion of said substrate to at least one printing liquid selected from the group consisting of ink and an abhesive fluid for ink; and (iii) an infrared laser ablatable mask layer which is substantially opaque to the actinic radiation and is capable of being removed upon exposure to an infrared laser radiation;

(b) imagewise exposing the plate with the infrared laser radiation to selectively remove the exposed areas of the mask layer;

(c) overall exposing the plate with the actinic radiation to cause hardening or solubilization of the photosensitive layer in the areas wherein the mask layer has been removed by the infrared laser radiation;

(d) exposing the plate with the infrared laser radiation in, at least, the areas which have not been exposed with infrared laser radiation in step (b) to substantially remove the remaining mask layer; and (e) contacting said exposed plate with ink (for waterless plate), or with ink and/or fountain solution (for wet plate) to remove the mask layer and develop the photosensitive layer, and to lithographically print images from said plate to the receiving medium.

DETAILED DESCRIPTION OF THE PREFERRED EMBODIMENTS

Plate Construction

The printing plate of this invention comprises a substrate, a photosensitive layer, and a mask layer. The photosensitive layer is capable of hardening (negative-working) or solubilization (positive-working) upon exposure to an actinic radiation. The mask layer is substantially opaque to the actinic radiation, and is capable of being removed upon exposure to an infrared laser radiation. Here, the printing plate can be a lithographic printing plate or a flexographic printing plate.

For a lithographic plate, the photosensitive layer should exhibit an affinity or aversion substantially opposite to the affinity or aversion of the substrate to at least one printing liquid selected from the group consisting of ink and an abhesive fluid for ink. For example, a wet plate can have a hydrophilic substrate and an oleophilic photosensitive layer, or can have an oleophilic substrate and a hydrophilic photosensitive layer; a waterless plate can have an oleophilic substrate and an oleophobic photosensitive layer, or can have an oleophobic substrate and an oleophilic photosensitive layer. An abhesive fluid for ink is a fluid which repels ink. Fountain solution is the most commonly used abhesive fluid for ink. A wet plate is printed on a wet press equipped with both ink and fountain solution, while a waterless plate is printed on a waterless press equipped with ink.

For an on-press ink and/or fountain solution developable lithographic plate of this invention, the non-hardened or solubilized areas of said photosensitive layer are soluble or dispersible in ink (for waterless plate) or in ink and/or fountain solution (for wet plate).

A developable interlayer may be inserted between the photosensitive layer and the mask layer to, for example, reduce adverse effects of laser heat on the photosensitive layer and to facilitate mask layer removal process. For on-press ink and/or fountain solution developable plate, the interlayer should be soluble or dispersible in ink and/or fountain solution.

For waterless plate, a silicone rubber layer may be coated above the photosensitive layer and under the mask layer (or interlayer). The silicone rubber is developed off in the non-hardened or solubilized areas of the photosensitive layer, and remains in the hardened or non-solubilized areas of the photosensitive layer to provide hydrophobicity. Conventional plates consisting of a substrate, a photosensitive layer and a top silicone rubber layer is disclosed in U.S. Pat. No. 6,045,963.

For plates with rough and/or porous hydrophilic surface capable of mechanical interlocking with a coating deposited thereon, a thin releasable (such as water-soluble) interlayer as described in U.S. Pat. No. 6,014,929, the entire disclosure of which is hereby incorporated by reference, may be deposited between the substrate and the photosensitive layer, wherein the substrate surface is rough and/or porous enough and the interlayer is thin enough to allow bonding between the photosensitive layer and the substrate through mechanical interlocking. The releasable interlayer should be soluble or dispersible in water, fountain solution, ink, an aqueous or solvent plate developer, an organic solvent, or a press cleaner.

A very thin transparent top layer (capable of being ablated off when coated on a laser ablative mask layer) can be deposited atop the mask layer to, for example, protect the mask layer from physical or chemical damage or to prevent the press operator from direct contact with the mask layer during handling. Examples of materials suitable for this top layer include water soluble polymers, solvent soluble polymers, and crosslinked polymeric resins. Various additives can be added in the top layer to enhance, for example, the surface properties of the plate. Such additives include, for example, surfactant and particulate dispersion. This top layer preferably has a thickness of less than 2 micrometer, and more preferably from 0.1 to 0.5 micrometer.

Laser Ablatable Mask Layer

For forming an infrared laser ablatable mask layer, any materials are suitable, which are opaque to an actinic light in the ultraviolet and visible region and capable of being removed upon infrared laser exposure. Examples of such materials include a dispersion of metal particles, infrared dye, or infrared pigment (including carbon black) in a polymeric matrix; a thin layer of metal (including metal alloy), or metal oxide; and a coating of conductive polymer. Dispersed silver is an example of dispersed metal particles. The laser ablatable mask layer can be a single layer; or it can consist of two or more sublayers, as long as the combined sublayers are opaque to the actinic radiation and can be removed all together upon infrared laser exposure. For example, there can be an inner infrared laser ablatable metal layer, and an outer polymer layer having actinic light absorber; infrared light absorber can also be added to the outer layer to enhance ablation efficiency. Metals absorb radiation in the infrared region as well as in the ultraviolet and visible region, and can be used as the sole mask layer of this invention. However, the metal film thickness allowing optimum infrared laser ablation usually absorbs less than 90% of the radiation in infrared region as well as in ultraviolet and visible region. Therefore, combination of a thin metal inner layer and an actinic light absorbing outer layer can provide the optimum ablatability and opaqueness. The mask layer, or the sublayers in the mask layer, can be deposited from a solution or dispersion which does not substantially dissolve or penetrate the photosensitive layer (or the interlayer), or can be deposited by vapor deposition. For mask layer having multiple sublayers, combination of vapor deposition and conventional liquid coating can be used. For example, the metal layer can be deposited by vapor deposition, and the polymeric coatings can be deposited by conventional liquid coating.

Various metals (including metal alloys), metal oxides, and metal sulfides can be used to form the mask layer or mask sublayer of this invention. Examples of metals, metal oxides, and metal sulfides useful as mask layer or mask sublayer include aluminum, alloys of aluminum, aluminum oxide, titanium, alloys of titanium, nickel, iron, chromium, and copper. Examples of laser ablatable metallic layers have been described in U.S. Pat. Nos. 5,171,650, 5,379,698, and RE35512, the entire disclosures of which are hereby incorporated by reference. Examples of laser ablatable layer consisting of metal oxide or metal sulfide, are described in U.S. Pat. No. 5,308,737. The metallic layers can be deposited by vapor deposition, electrochemical deposition, and other means. Vapor deposition is a preferred method. The metal, metal alloy, metal oxide, and metal sulfide can be vapor deposited using, for example, resistance heater, sputtering, and electron beam techniques under vacuum. The techniques for deposition of metal, metal alloy, metal oxide, and metal sulfide are well known, and are described in, for example, U.S. Pat. No. 4,430,366 and the book Vacuum Deposition of Thin Films (L. Holland, 1970, Chapman and Hall, London, England). The thickness of the metal and/or metal oxide layer should be preferably less than 200 Å, and more preferably between 30 and 100 Å. The optical density of the metal and/or metal oxide layer should be preferably less than 3.0, and more preferably between 0.2 to 1.0. In addition to metal, metal alloy, metal oxide, and metal sulfide, certain polymers, organic compounds, and inorganic compounds can also be vapor deposited.

For mask layer or sublayer deposited by conventional coating method, the depositing solution or dispersion may be an aqueous or solvent solution or dispersion. A solvent, aqueous alkaline or water soluble or dispersible binder may be used. Various additives may be added in the mask layer to enhance certain properties of the plate. Such additives include surfactant, dispersing agent, coalescing agent (for polymeric dispersion), infrared light absorbing dye or pigment, ultraviolet light absorbing dye or pigment, plasticizer, and thermal ablation-enhancing materials (such as gas generating compounds). Usually a single pigment or dye (such as a metal, carbon black or a certain infrared dye) can function as infrared absorber as well as actinic (usually ultraviolet) light absorber. For example, carbon black is a pigment which absorbs in both the infrared region and the ultraviolet region (as well as the visible region); most infrared dye also absorbs in the ultraviolet region. However, combination of an infrared light absorbing pigment or dye and an actinic light absorbing pigment or dye can also be used in the mask layer. The mask layer may contain one or more infrared light absorbing dye or pigment. Likewise, the mask layer may contain one or more ultraviolet light absorbing dye or pigment. The thickness of the mask layer is preferably chosen so that sufficient opaqueness to the actinic light is obtained while maintaining suitable infrared laser sensitivity. Preferably, 90% or more of the actinic light is absorbed by the mask layer, more preferably 99%, and most preferably 99.9%. The mask layer should be thick enough to have sufficient opaqueness and at the mean time thin enough so that the mask layer can be removed efficiently in the areas exposed with laser at a practical dosage. The polymer based mask layer or sublayer preferably has a thickness of less than 4 micrometer, and more preferably from 0.3 to 1.5 micrometer.

Interlayer

Optionally, an interlayer can be interposed between the mask layer and the photosensitive layer to reduce, for example, adverse effects of laser heat on the photosensitive layer.

The interlayer should be soluble or dispersible in a suitable developer for the photosensitive layer, and substantially transparent to the actinic light. For on-press ink and/or fountain solution developable plate, the interlayer should be soluble or dispersible in ink (for waterless plate) or in ink and/or fountain solution (for wet plate). The interlayer may consist of any material with the desired properties. Polymers are the preferred materials. A solvent, aqueous alkaline or water soluble or dispersible binder may be used. A solvent soluble polymer dispersed in water (such as latex) may be used to form an ink soluble or dispersible interlayer. The interlayer may be deposited onto the photosensitive layer through any means. However, it would be preferred that the interlayer can be deposited from a solution or dispersion which does not substantially dissolve or penetrate the photosensitive layer so that an inexpensive conventional coating process can be used. Various additives may be added in the interlayer to enhance certain properties of the plate. Such additives include surfactant, dispersing agent, dye, and pigment. The interlayer preferably has a thickness of from 0.1 to 4 micrometer, and more preferably from 0.3 to 1.5 micrometer.

Photosensitive Layer for Lithographic Plate

For preparing the photosensitive (also called radiation-sensitive) layer of the lithographic plate of the current invention, any photosensitive material is suitable which is capable of hardening or solubilization upon exposure to an actinic radiation in ultraviolet and visible region (about 150 to about 650 nm in wavelength). Here hardening means becoming insoluble and non-dispersible in a suitable developer (negative-working), and solubilization means becoming soluble or dispersible in a suitable developer (positive-working). For on-press ink and/or fountain solution developable lithographic plates, the developer can be ink and/or fountain solution. The photosensitive layer preferably has a coverage of from 0.1 to 6.0 g/m$^2$, and more preferably from 0.4 to 3.0 mg/m$^2$.

Photosensitive materials useful in negative-working wet plates include silver halide emulsions, as described in U.S. Pat. No 5,620,829 and references noted therein; polycondensation products of diazonium salts, as described in U.S. Pat. Nos.3,679,416, 3,867,147, and 4,631,245 and references noted therein; compositions comprising acrylic monomers, polymeric binders, and photoinitiators, as described in U.S. Pat. Nos. 5,407,764 and 4,772,538 and references noted therein; light-sensitive compositions comprising polyflnctional vinyl ethers or epoxy monomers, and cationic photoinitiators, as described in U.S. Pat. Nos. 4,593,052 and 4,624,912 and references noted therein; cinnamal-malonic acids and functional equivalents thereof and others described in U.S. Pat. No. 3,342,601 and references noted therein; and dual layer light sensitive materials described in U.S. Pat. No. 5,476,754 and references noted therein.

Photosensitive materials useful in positive-working wet plates include diazo-oxide compounds such as benzoquinone diazides and naphthoquinone diazides, as described in U.S. Pat. No. 4,141,733 and references noted therein; and compositions comprising a photo acid generator and a polymer having acid labile groups, as described in U.S. Pat. No. 5,395,734 and references noted therein.

Photosensitive oleophobic materials useful in waterless plates include compositions comprising polymers having perfluoroalkyl groups and crosslinkable terminal groups, as described in U.S. Pat. Nos. 4,074,009 and 5,370,906 and references therein; compositions comprising polysiloxane and crosslinkable resins, as described in U.S. Pat. No. 4,259,905 and references therein; and compositions comprising a diazonium salt and an abhesive acid or salt thereof, as described in U.S. Pat. No. 3,997,349 and references noted therein.

In a preferred embodiment as for negative-working wet lithographic printing plates of this invention, the photosensitive layer comprises at least one polymeric binder (with or without ethylenic functionality), at least one photopolymerizable ethylenically unsaturated monomer (or oligomer) having at least one terminal ethylenic group capable of forming a polymer by free-radical polymerization, at least one photosensitive free-radical initiator (including sensitizer), and other additives such as surfactant, dye or pigment, radiation exposure-indicating dye (such as leuco crystal violet, azobenzene, 4-phenylazodiphenylamine, and methylene blue dyes), and free-radical stabilizer (such as methoxyhydroquinone). Suitable polymeric binders include polystyrene, acrylic polymers and copolymers (such as polybutylmethacrylate, polyethylmethacrylate, polymethylmethacrylate, polymethylacrylate, butylmethacrylate/methylmethacrylate copolymer), polyvinyl acetate, polyvinyl chloride, styrene/acrylonitrile copolymer, nitrocellulose, cellulose acetate butyrate, cellulose acetate propionate, vinyl chloride/vinyl acetate copolymer, partially hydrolyzed polyvinyl acetate, polyvinyl alcohol partially condensation-reacted with acetaldehye, and butadiene/acrylonitrile copolymer. Suitable free-radical polymerizable monomers (including oligomers) include multifunctional acrylate monomers or oligomers, such as acrylate and methacrylate esters of ethylene glycol, trimethylolpropane, pentaerythritol, ethoxylated ethylene glycol and ethoxylated trimethylolpropane, multifunctional urethanated acrylate and methacrylate (such as Sartomer CN970 and CN975 from Sartomer Company, Exton, Pa.), and epoxylated acrylate or methacrylate (such as Sartomer CN104 and CN120 from Sartomer Company, Exton, Pa.), and oligomeric amine diacrylates. Suitable photosensitive free-radical initiators include the derivatives of acetophenone (such as 2,2-dimethoxy-2-phenylacetophenone, and 2-methyl-1-[4-(methylthio)phenyl]-2-morpholino propan-1-one), benzophenone, benzil, ketocoumarin (such as 3-benzoyl-7-methoxy coumarin and 7-methoxy coumarin), xanthone, thioxanthone, benzoin or an alkyl-substituted anthraquinone, s-triazine (such as 2,4-bis(trichloromethyl)-6-(1-(4-methoxy)naphthyl)-1,3,5-triazine), and titanocene (bis($\eta^9$-2,4-cyclopentadien-1-yl), bis[2,6-difluoro-3-(1H-pyrrol-1-yl)phenyl) titanium).

In a second preferred embodiment as for negative-working wet lithographic printing plates of this invention, the photosensitive layer comprises a polycondensation product of diazonium salt (diazo resin), with or without a polymeric binder, and other additives such as colorants, stabilizers, exposure indicators, surfactants and the like. Particularly useful diazo resins include, for example, the condensation product of p-diazodiphenylamine and formaldehyde, the condensation product of 3-methoxy-4-diazodiphenylamine and formaldehyde, and the diazo resins of U.S. Pat. Nos. 3,867,147, 4,631,245 and 5,476,754, and references noted therein. Particularly useful polymeric binders for use with such diazo resins include, for examples, acetal polymers and their derivatives as described in U.S. Pat. Nos. 4,652,604, 4,741,985, 4,940,646, 5,169,897 and 5,169,898, and references noted therein; and polymeric binders with carboxylic acid groups, as described in U.S. Pat. No. 4,631,245.

In another preferred embodiment as for negative-working wet lithographic printing plates of this invention, the photosensitive layer comprises at least one polyfunctional vinyl ether or epoxy monomer (or oligomer), at least one cationic photoinitiator (including sensitizer), optionally one or more polymeric binders, and other additives such as colorants, stabilizers, exposure indicators, surfactants and the like. Examples of useful polyfunctional epoxy monomers are 3,4-epoxycyclohexylmethyl-3,4-epoxycyclohexane carboxylate, bis-(3,4-epoxycyclohexymethyl) adipate, difimctional bisphenol A/epichlorohydrin epoxy resin and multifunctional epichlorohydrin/tetraphenylol ethane epoxy resin. Examples of useful cationic photoinitiators are triarylsulfonium hexafluoroantimonate and triarylsulfonium hexafluorophosphate. Examples of useful polymeric binders are polybutylmethacrylate, polymethylmethacrylate and cellulose acetate butyrate.

In order to be useful for the on-press ink and/or fountain solution developable plate of this invention, the photosensitive layer must be capable of hardening or solubilization upon exposure to an actinic radiation, and the non-hardened (for negative-working plate) or solubilized (for positive-working plate) areas of the photosensitive layer must be soluble or dispersible in ink and/or fountain solution and can therefore be developed off on a lithographic press with ink and/or fountain solution. Various on-press ink and/or fountain solution developable photosensitive layers have been disclosed in the patent literature and can be used for preparing the on-press ink and/or fountain solution developable plate of this invention. Patents describing on-press ink and/or fountain solution developable photosensitive layer include, for example, U.S. Pat. Nos. 5,516,620, 5,677,108, 5,776,654, 5,811,220, 5,997,993, 6,014,929, 6,071,675, and 6,027,857.

Photosensitive Layer for Flexographic Plate

Photosensitive layer compositions for flexographic plate are widely described in the patent literature and can be used for the flexographic plate of this invention. Patents describing photosensitive layer compositions for flexographic plate include, for example, U.S. Pat. Nos. 5,348,844, 5,719,009, 5,607,814, 5,925,500, 6,020,108, 6,037,102, and 5,888,697.

A preferred photosensitive layer for flexographic plate of this invention comprises at least one elastomeric binder (with or without ethylenic functionality), at least one photopolymerizable ethylenically unsaturated monomer (or oligomer) having at least one terminal ethylenic group capable of forming a polymer by free-radical polymerization, and at least one photosensitive free-radical initiator (including sensitizer). Other additives such as surfactant, dye or pigment, radiation exposure-indicating dye (such as leuco crystal violet, azobenzene, 4-phenylazodiphenylamine, and methylene blue dyes), and free-radical stabilizer (such as methoxyhydroquinone) may be added.

The thickness of the photosensitive layer for flexographic plate can vary over a wide range depending on the type of printing plate desired. The photosensitive layer typically have a thickness of from about 0.010 to about 0.250 inches. The most preferred photosensitive layer thickness is about 0.015 to about 0.125 inches.

Substrate for Lithographic Plate

The substrate employed in the lithographic plates of this invention can be any lithographic support. Such a substrate may be a metal sheet, a polymer film, or a coated paper. Aluminum (including aluminum alloys) sheet is a preferred metal support. Particularly preferred is an aluminum support which has been grained, anodized, and deposited with a barrier layer. Polyester film is a preferred polymeric film support. A surface coating may be coated to achieve desired surface properties. For wet plate, the substrate should have a hydrophilic or oleophilic surface, depending on the surface properties of the photosensitive layer; commonly, a wet lithographic plate has a hydrophilic substrate and an oleophilic photosensitive layer. For waterless plate, the substrate should have an oleophilic or oleophobic surface, depending on the surface properties of the photosensitive layer.

Particularly preferred hydrophilic substrate for a wet lithographic plate is an aluminum support which has been grained, anodized, and deposited with a hydrophilic barrier layer. Surface graining (or roughening) can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic plate application are well known in the art, and examples can be found in U.S. Pat. Nos. 2,714,066, 4,153,461, 4,399,021, and 5,368,974. Suitable polymer film supports for a wet lithographic plate include a polymer film coated with a hydrophilic layer, preferably a hydrophilic layer which is crosslinked, as described in U.S. Pat. No. 5,922,502.

Substrate for Flexographic Plate

The substrates (or supports) suitable for preparing flexographic plate of this invention can be any dimensionally stable material, and are widely described in the patent literature, such as U.S. Pat. Nos. 5,348,844, 5,888,697, and 6,037,102. Examples of particularly suitable dimensionally stable substrate are plates, sheets, and conical or cylindrical sleeves of metal such as steel, aluminum, copper, or nickel; plastics such as polyethylene terephthalate, polybutylene terephthalate, polyamide, and polycarbonate; woven and nonwoven fabrics such as glass fiber fabrics; and composite materials comprising glass fibers and plastics.

Exposure and Development

The actinic light can be an ultraviolet light or visible light. Examples of actinic light sources include a high pressure mercury lamp, a xenon lamp, and a fluorescence lamp. It is noted that the term actinic light or actinic radiation in this patent refers to radiation which can cause hardening or solubilization of the photosensitive layer. The actinic radiation in this patent should be in the region from ultraviolet light to visible light (about 150 to about 650 nm in wavelength). Ultraviolet light is a preferred actinic radiation.

Infrared lasers useful for imagewise exposure for the mask layer include laser sources emitting in the wavelength range of above 700 um, preferably 700–1500 nm. Particularly preferred infrared laser sources are laser diodes emitting around 830 nm or a NdYAG laser emitting around 1060 nm.

Infrared laser imaging devices are currently widely available commercially. Any device can be used which provides imagewise infrared laser exposure according to digital image information. Commonly used imaging devices include flatbed imager, internal drum imager, and external drum imager. Internal drum imager and external drum imager are preferred imaging devices. A vacuum filtering device may be attached next to the laser head to collect and filter out the debris from the ablated mask layer.

After the first imagewise infrared laser exposure to remove the exposed areas of mask layer, the plate is subjected to an actinic light overall exposure, followed by a second infrared laser exposure in, at least, the non-ablated areas to substantially remove the non-ablated mask layer. The second laser exposure can be only in the areas which have not been exposed with the first laser exposure (complimentary exposure), or can be an overall scan to expose the whole areas (as long as the plate is robust enough to withstand a second laser exposure in the same areas). It is preferred that the second laser exposure only exposes the areas which have not been exposed during the first laser exposure. For certain plates, especially plates with a developable interlayer, the developer can remove the mask layer in the partially laser exposed areas (by penetrating from underneath or from the side) but not in the larger laser unexposed areas (such as larger than 30 micrometers in all directions). For such a plate, a second laser exposure only in the lager laser unexposed areas is sufficient to make the plate developable.

In some case, a cleaning process may be performed between the first imagewise laser exposure and the overall exposure, to remove any debris caused by the first laser exposure. Examples of the cleaning process include wiping with a cloth and air blowing.

The plate can be exposed with an actinic light in a regular plate exposure device with or without the plate being under vacuum, or can be directly exposed on the same imaging device for the infrared laser exposure with the plate being on the drum or the flatbed. The actinic light may irradiate the plate during the imagewise laser exposure or may irradiate the plate only after the imagewise laser exposure is completed. An actinic light source may be fixed within the imager or next to the infrared laser. The plate can also be exposed on a printing press cylinder (for the first laser imagewise exposure, overall actinic radiation, and the second laser exposure), and the exposed plate can be directly processed and printed on press. For lithographic plate, the plate can be developed on press (automatically or manually) by wiping with a cloth dampened with a developer solution.

For plate with ink and/or fountain solution soluble or dispersible photosensitive layer, the fully exposed plate can be developed on press with ink (for waterless plate) or with ink and/or fountain solution (for wet plate). The plate is mounted on the press cylinder as for a conventional plate to be printed. The press is then started to contact the plate with ink (for waterless plate) or with ink and/or fountain solution (for wet plate) to develop the photosensitive layer, and to lithographically print images from said plate to the receiving medium. The imagewise infrared laser exposure, overall actinic light exposure, second infrared laser exposure, on-press development, and lithographic printing can be performed with the plate being mounted on the same plate cylinder of a lithographic press. Alternatively, the exposures can be performed off press, and the exposed plate is then mounted to a printing press for on-press development and printing. For wet press, usually fountain solution is applied (to contact the plate) first, followed by contacting with ink roller, or an emulsion of ink and fountain solution is applied together (for press with integrated dampening system). However, ink roller may be applied first, or both ink roller and fountain solution can be applied the same time. This depends on the capability of the plate and the design of the press.

This invention is further illustrated by the following examples of its practice. Unless specified, all the values are by weight.

EXAMPLE 1

An electrochemically roughened, anodized, and polyvinyl phosphonic acid treated aluminum sheet was used as the plate substrate. The aluminum substrate was coated using a #6 Meyer rod with a photosensitive layer formulation PS-1, followed by drying in an oven at 70° C. for 8 min.

| Formulation PS-1 | Weight (g) |
| --- | --- |
| Neocryl B-728 polymer (from Zeneca) | 12.02 |
| Ebecryl RX8301 oligomer (from UCB Chemicals) | 3.21 |
| Sartomer SR-399 monomer (from Sartomer) | 20.04 |
| Irgacure 907 initiator (from Ceiby-Geigy) | 1.60 |
| Isopropyl thioxanthone (Sensitizer) | 0.80 |
| Methoxyether hydroquinone (Antioxidant) | 0.04 |
| Irganox 1035 antioxidant (from Ciba Geigy) | 0.04 |
| Orasol Blue GN dye (from Ciba Geigy) | 0.32 |
| Leuco crystal violet (Exposure indicator) | 0.32 |
| Pluronic L43 surfactant (from BASF) | 1.60 |

-continued

| Formulation PS-1 | Weight (g) |
| --- | --- |
| Cyclohexanone | 40.0 |
| Methylethylketone | 320.0 |

The photosensitive layer coated plate was further coated with a mask layer formulation ML-1 using a #5 Meyer rod, followed by drying in an oven at 70° C. for 8 min.

| Formulation ML-1 | Weight ratios |
| --- | --- |
| UNISPERSE BLACK C-E2N | 6.25 |
| (45% wt., aqueous black dispersion from Ciba-Geigy) | |
| IR-125 (infrared dye from Eastman Kodak) | 0.94 |
| Glycerol | 1.25 |
| Airvol 603 (polyvinyl alcohol from Air Products and Chemicals Co.) | 1.25 |
| FC120 (25% wt., surfactant from 3M) | 0.06 |
| Water | 90.25 |

The above plate was exposed with an infrared laser plate imager equipped with laser diodes (8-channels, about 500 mW each) emitting at 830 nm with a laser size of about 15 micrometer. The plate was placed on the imaging drum (external drum with a circumference of 1 meter) and secured with vacuum and master tapes. The exposure dosage was controlled by the drum speed. The plate was exposed at a laser dosage of 500 mJ/cm$^2$ to substantially remove the mask layer in the exposed areas by ablation. The laser imaged plate was overall exposed to an ultraviolet (UV) light with an emission peak of about 364 nm for 2 min. The overall UV exposed plate was further exposed with the above infrared laser radiation in the areas not exposed during the first laser exposure.

The fully exposed plate was subjected to hand test for on-press developability. The plate was rubbed 10 times with a cloth soaked with both fountain solution (prepared from Superlene Brand All Purpose Fountain Solution Concentrate made by Varn, Oakland, N.J.) and ink (Sprinks 700 Acrylic Black ink from Sprinks Ink, Fla.) to check on-press developability and inking; additional 200 rubs were performed to check the durability of the plate. The plate developed completely under 6 double rubs (A double rub is defined as a back-and-forth rub.). The UV non-exposed areas of the photosensitive layer were completely removed from the substrate, and the UV exposed areas of the photosensitive layer remained on the substrate. The developed plate showed good imaging pattern, clean background, and good durability (no wearing off at 200 rubs).

A second plate having the same composition and exposed with the same process as above was tested for conventional development with Viking Aqueous Negative Plate Developer (from 3M). About 30 grams of the developer was poured on the plate and was spread across the whole plate with a cloth. The dissolved photosensitive layer was wiped off with the cloth. The developed plate was wiped with a gum arabic solution (from Varn, Okland, N.J.) and then tested for inking by spraying with fountain solution and rubbing with a cloth dampened with both fountain solution and ink for 10 times. Additional 200 rubs were performed to check the durability of the plate. This conventionally developed plate showed good imaging, clean background, and good durability (no wearing off at 200 rubs).

EXAMPLE 2

In this example, a different second laser exposure procedure was used to remove the remaining mask layer. The same infrared laser imager and UV exposure device as in EXAMPLE 1 were used. The plate was the same as in EXAMPLE 1. The plate was first imagewise exposed with an 830 nm infrared laser at 500 mJ/cm² to remove the mask layer in the exposed areas, followed by overrall exposure with UV light for 2 min. The overall UV exposed palte was further exposed with the above infrared laser radiation across the whole plate (covering all the areas). The remaining areas of the mask layer was completely removed.

The plate was hand developed with ink and fountain solution as in EXAMPLE 1. the plate developed completely under 4 double rubs, with the non-imaging areas of the photosensitive layer being completely removed. The developed plate showed good imaging pattern, clean background, and good durability.

I claim:

1. A method of imaging a lithographic plate, comprising in order:
    (a) providing a lithographic plate comprising in order: (i) a substrate; (ii) a photosensitive layer capable of hardening (negative-working) or solubilization (positive-working) upon exposure to an actinic radiation in ultraviolet and visible region and exhibiting an affinity or aversion substantially opposite to the affinity or aversion of said substrate to at least one printing liquid selected from the group consisting of ink and an abhesive fluid for ink; and (iii) an infrared laser ablatable mask layer which is substantially opaque to the actinic radiation and is capable of being removed upon exposure to an infrared laser radiation;
    (b) imagewise exposing the plate with the infrared laser radiation to selectively remove the exposed areas of the mask layer;
    (c) overall exposing the plate with the actinic radiation to cause hardening or solubilization of the photosensitive layer in the areas wherein the mask layer has been removed by the infrared laser radiation; and
    (d) further exposing the plate with the infrared laser radiation in, at least, part or all of the areas which have not been exposed with infrared laser radiation in step (b) to substantially remove the mask layer in said areas.

2. The method of claim 1 wherein the second infrared laser exposure covers only all the areas which have not been exposed with the first imagewise infrared laser exposure.

3. The method of claim 1 wherein the second infrared laser exposure covers the whole areas of the lithographic plate.

4. The method of claim 1 wherein the second infrared laser exposure breaks down the larger continuous laser non-ablated areas into smaller laser non-ablated areas.

5. The method of claim 1 wherein said plate is mounted on the same imaging drum or flatbed for the first imagewise infrared laser exposure, the actinic light overall exposure, and the second infrared laser exposure.

6. The method of claim 1 wherein said plate is mounted on the plate cylinder of a printing press for the first imagewise infrared laser exposure, the actinic light overall exposure, and the second infrared laser exposure.

7. The method of claim 1 wherein said photosensitive layer is oleophilic, said substrate is hydrophilic, and said plate is a wet lithographic plate.

8. The method of claim 1 wherein said photosensitive layer is oleophobic, said substrate is oleophilic, and said plate is a waterless lithographic plate.

9. The method of claim 1 wherein said mask layer comprises an infrared light absorbing material selected from the group consisting of carbon black, dispersed metal particles, infrared light absorbing dye, and conducting polymer.

10. The method of claim 1 wherein said mask layer comprises a metal and/or metal oxide layer.

11. The method of claim 1 wherein said mask layer comprises a metal and/or metal oxide inner sublayer and an actinic light absorbing outer sublayer.

12. The method of claim 1 wherein said plate further includes an interlayer interposed between the mask layer and the photosensitive layer, said interlayer being soluble or dispersible in a suitable developer for the photosensitive layer, and is substantially transparent to the actinic radiation.

13. The method of claim 1 wherein said plate further includes a releasable sublayer interposed between the substrate and the photosensitive layer, said releasable sublayer being soluble or dispersible in a suitable developer for the photosensitive layer; wherein the substrate comprises rough and/or porous surface capable of mechanical interlocking with a coating deposited thereon, and the releasable sublayer is substantially conformally coated on the microscopic surface of the substrate and is thin enough in thickness, to allow mechanical interlocking between the photosensitive layer and the substrate.

14. A method of lithographically printing images on a receiving medium, comprising in order:
    (a) providing a lithographic plate comprising in order: (i) a substrate; (ii) a photosensitive layer capable of hardening (negative-working) or solubilization (positive-working) upon exposure to an actinic radiation in ultraviolet and visible region, the non-hardened or solubilized areas of said photosensitive layer being soluble or dispersible in ink (for waterless plate) or in ink and/or fountain solution (for wet plate), and said photosensitive layer exhibiting an affinity or aversion substantially opposite to the affinity or aversion of said substrate to at least one printing liquid selected from the group consisting of ink and an abhesive fluid for ink; and (iii) an infrared laser ablatable mask layer which is substantially opaque to the actinic radiation and is capable of being removed upon exposure to an infrared laser radiation;
    (b) imagewise exposing the plate with the infrared laser radiation to selectively remove the exposed areas of the mask layer;
    (c) overall exposing the plate with the actinic radiation to cause hardening or solubilization of the photosensitive layer in the areas wherein the mask layer has been removed by the infrared laser radiation;
    (d) exposing the plate with the infrared laser radiation in, at least, the areas which have not been exposed with infrared laser radiation in step (b) to substantially remove the remaining mask layer; and
    (e) contacting said exposed plate with ink (for waterless plate), or with ink and/or fountain solution (for wet plate) to remove the mask layer and develop the photosensitive layer, and to lithographically print images from said plate to the receiving medium.

15. The method of claim 14 wherein said plate is mounted on the same imaging drum or flatbed for the first imagewise infrared laser exposure, the actinic light overall exposure, and the second infrared laser exposure.

16. The method of claim 14 wherein said plate is mounted on the same plate cylinder of a lithographic press for the first imagewise infrared laser exposure, overall actinic light exposure, second infrared laser exposure, on-press development, and lithographic printing.

17. The method of claim 14 wherein the second infrared laser exposure covers only the areas which have not been exposed with the first imagewise infrared laser exposure.

18. The method of claim 14 wherein said substrate is hydrophilic, and said photosensitive layer is photohardenable and comprises an oleophilic polymeric binder, a monomer or oligomer with at least one acrylate or methacrylate fuinctional group, and a photosensitive free-radical initiator.

19. A method of imaging a flexographic printing plate, comprising in order:

(a) providing a flexographic plate comprising in order: (i) a substrate; (ii) a photosensitive layer capable of hardening or solubilization upon exposure to an actinic radiation in ultraviolet and visible region; and (iii) an infrared laser ablatable mask layer which is substantially opaque to the actinic radiation and is capable of being removed upon exposure to an infrared laser radiation;

(b) imagewise exposing the plate with the infrared laser radiation to selectively remove the exposed areas of the mask layer;

(c) overall exposing the plate with the actinic radiation to cause hardening or solubilization of the photosensitive layer in the areas wherein the mask layer has been removed by the infrared laser radiation; and (d) farther exposing the plate with the infrared laser radiation in, at least, some or all of the areas which have not been exposed with infrared laser radiation in step (b) to substantially remove the mask layer in said areas.

20. The method of claim 19 wherein said photosensitive layer is photohardenable and comprises an elastomeric binder, a monomer or oligomer with at least one acrylate or methacrylate functional group, and a photosensitive free-radical initiator.

* * * * *